INVENTOR.
WALTER ZIFFER
BY
Shenier & O'Connor
ATTORNEYS

INVENTOR.
WALTER ZIFFER
BY
Shenier & O'Connor
ATTORNEYS

May 17, 1966

W. ZIFFER 3,252,063

PLANAR POWER TRANSISTOR HAVING ALL CONTACTS ON THE SAME SIDE THEREOF

Filed July 9, 1963

3 Sheets-Sheet 3

INVENTOR.
WALTER ZIFFER
BY
Sherier & O'Connor
ATTORNEYS

United States Patent Office 3,252,063
Patented May 17, 1966

3,252,063
PLANAR POWER TRANSISTOR HAVING ALL CONTACTS ON THE SAME SIDE THEREOF

Walter Ziffer, Norwalk, Conn., assignor to United Aircraft Corporation, East Hartford, Conn., a corporation of Delaware Filed July 9, 1963, Ser. No. 293,664
6 Claims. (Cl. 317—235)

My invention relates to a planar power transistor and more particularly to an improved planar power transistor which is more efficient than are power transistors of this type known in the art.

It has been suggested in the prior art that planar microelectric components be formed into integrated circuits. These circuits of course require power transistors. Owing to the configuration of the circuits, all the elements making up a planar power transistor for example must be contacted from the same side of the wafer carrying the components. That is, ohmic contacts must be made from each of the emitter, the base and the collector on the same side of the wafer.

Two possible configurations have been suggested in the prior art for planar power transistors. In the first of these, the base contact, which is placed on base material diffused into the collector substrate, surrounds the emitter. In order to permit the contact to be placed on the base, the latter must be made of an appreciable area. In this configuration, while current emission occurs from the emitter edge which is the closest portion of the emitter to the collector, the current is required to flow through a relatively thin high-resistivity layer beneath the base before it reaches the collector contact. Owing to this fact, the power transistor having this configuration is relatively inefficient.

A further suggestion which has been made in the prior art is that the emitter surround the base contact carried by base material diffused into the collector substrate. While this configuration provides an emitter edge which is relatively close to the collector contact, the current is emitted principally at the inner edge of the emitter from whence it must flow through a thin high-resistivity region underneath the width of the emitter in order to reach the collector contact.

A possible solution to the problems involved in the configurations discussed above is to increase the thickness of the collector region below the base or below the emitter in order to reduce its resistance. This solution has not proved satisfactory for various reasons such as the increased size of the component and the difficulty of then producing electrical separation of regions in an integrated circuit by means of diffused moats of opposite conductivity type.

I have invented an improved planar power transistor which overcomes the defects of planar power transistors of the prior art. My improved transistor is more efficient than are planar power transistors of the prior art. My transistor has a relatively low series collector resistance. It provides optimum power output for its size.

One object of my invention is to provide a planar power transistor which overcomes the defects of planar power transistors of the prior art.

Another object of my invention is to provide an improved planar power transistor which is more efficient than power transistors of the prior art.

A further object of my invention is to provide an improved planar power transistor which has a low series collector resistance and yet which is not inconsistent with other requirements for integrated circuits.

Still another object of my invention is to provide a planar power transistor in which the power output is optimized for the size of my transistor.

Yet another object of my invention is to provide an improved planar power transistor which is especially adapted for use in an integrated circuit.

Other and further objects of my invention will appear from the following description.

In general my invention contemplates the provision of a planar power transistor especially adapted for use in integrated circuits in which elongated relatively narrow areas of base-forming material leading from a remote base ohmic contact apply the base potential to emitter edges located closely adjacent to collector areas.

In the accompanying drawings which form part of the instant specification and which are to be read in conjunction therewith and in which like reference numerals are used to indicate like parts in the various views.

Figure 3:
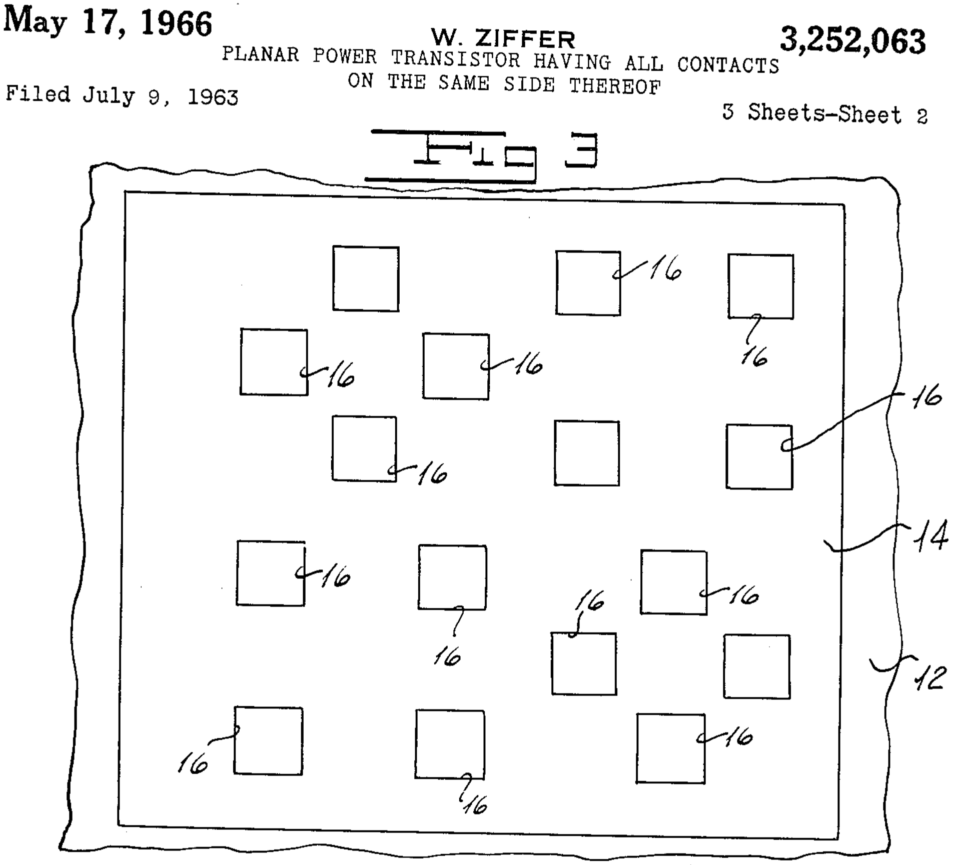
FIGURE 3 is a plan view illustrating a certain diffused area of my improved planar power transistor.

Referring now to the drawings, my improved planar power transistor indicated generally by the reference character 10 includes a substrate 12 of suitable n-type material such, for example, as a silicon wafer. In order to form the base element of my transistor, I diffuse a suitable impurity or dopant into the wafer 12 over a preselected area. As can best be seen by reference to FIGURE 3, this area 14 is generally rectangular in outline. The area encompasses a plurality of generally square areas 16 which are not diffused with the impurity so that the substrate 12 is left exposed in these areas.

The doping operation described above can be accomplished by suitable techniques known to the art. First the wafer 12 may be provided with an oxide film which is then etched to provide a mask which is a negative of the pattern of area 14. This can be accomplished by photoresist techniques known to the art. When this has been done, the dopant is diffused into the exposed areas to provide the p-type regions to be described hereinafter. A suitable impurity such as boron, aluminum, gallium, indium or thallium can be vacuum-sealed together with the wafers in a tube or by any other method known to the art.

Figure 4:
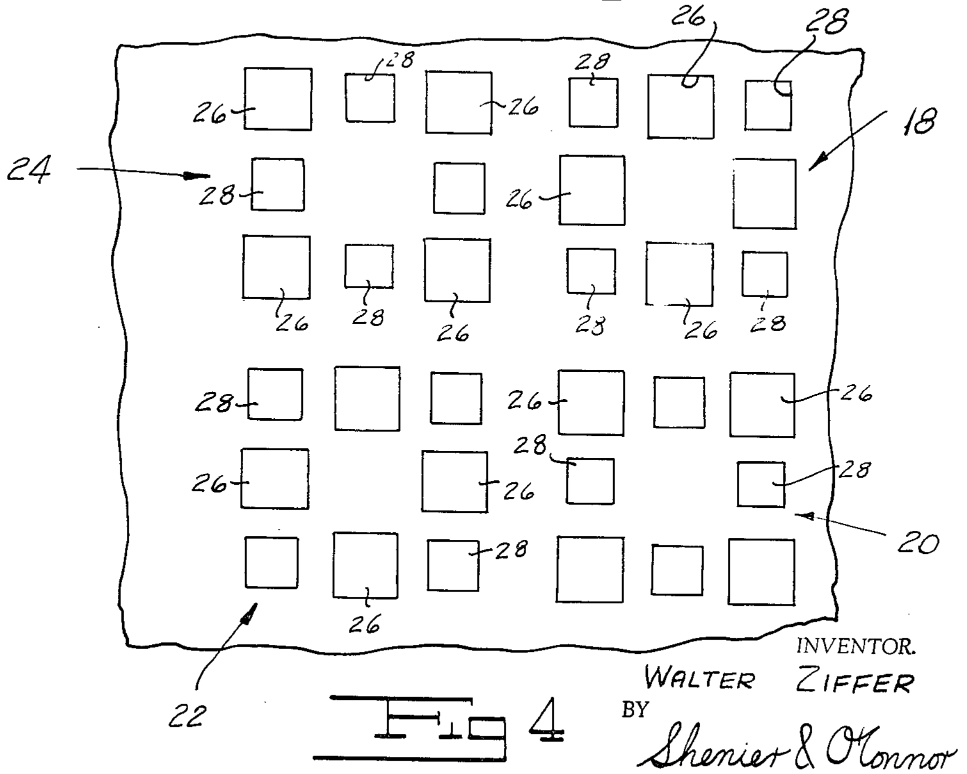
FIGURE 4 is a plan view illustrating other diffused areas of my improved planar power transistor.

After the p-type regions have been formed in the manner described above, a new oxide mask is applied to the wafer and is photoetched to provide a negative of the pattern shown in FIGURE 4. Next the exposed areas are diffused with an $n^+$-type impurity. It will be seen that this results in four respective groups of areas, which groups are indicated generally by reference characters 18, 20, 22 and 24 in FIGURE 4. Each group of areas 18, 20, 22 and 24 comprises a plurality of generally square areas 26 of $n^+$ material diffused into the previously p-diffused material to a depth less than a diffusion length for minority carriers in the p-diffused region smaller than the depth of the previous p-diffusion. As will be described hereinafter, these areas form emitter elements of my improved planar power transistor.

Each of the groups 18, 20, 22 and 24 includes a plurality of other generally square areas 28 of $n^+$ diffused material. These areas 28 are diffused into the exposed areas 16 of the n-type substrate and are generally concentric therewith. I provide the areas 28 in the n-type collector substrate in order to permit ohmic contacts to be made to the collector.

When the two doping operations described above have been accomplished, I next apply conductive material to the assembly in a predetermined pattern to produce the required ohmic contacts for making connections to the various elements of the transistor 10. To achieve this, I employ the photoresist technique known in the art to form a negative oxide pattern of the pattern of conductive material desired and then apply a suitable conductor material such, for example, as aluminum or the like to the exposed areas. This operation results in a plurality of conductive contacts 36 for the collector.

Each area of conductive material 36 is received by one of the $n^+$ doped areas 28 which I provided to permit the conductive material to be applied to make contact with the n-type collector substrate 12. A plurality of other areas 38 are deposited on the $n^+$ doped areas 26 forming emitter elements of my planar power transistor.

I apply a generally rectangular area 40 of conductive material running adjcent the periphery of the p-type base forming area 14 and surrounding all of the contacts 36 and 38. A relatively wide side 42 of the area 40 provides space to permit a conductor to be attached to the base contact. Respective cross bars 44 and 46 of conductive material connect the opposite sides of the rectangular area 40. I also apply a plurality of generally square or rectangular areas 50 of conductive material located centrally of each of the groups of areas 26 and 28.

Owing to the configuration of the form of my planar power transistor shown in FIGURES 1 to 4, a length 48 of p-type material extends from the conductive material of the ohmic contacts into the space between each pair of adjacent emitter elements 26 and corresponding collector areas 28. These lengths 48 are sufficiently narrow that the path for current flow from the edge of an emitter element to the collector contact area 28 is extremely short as compared with the path in planar transistor configurations of the prior art.

Figure 5:
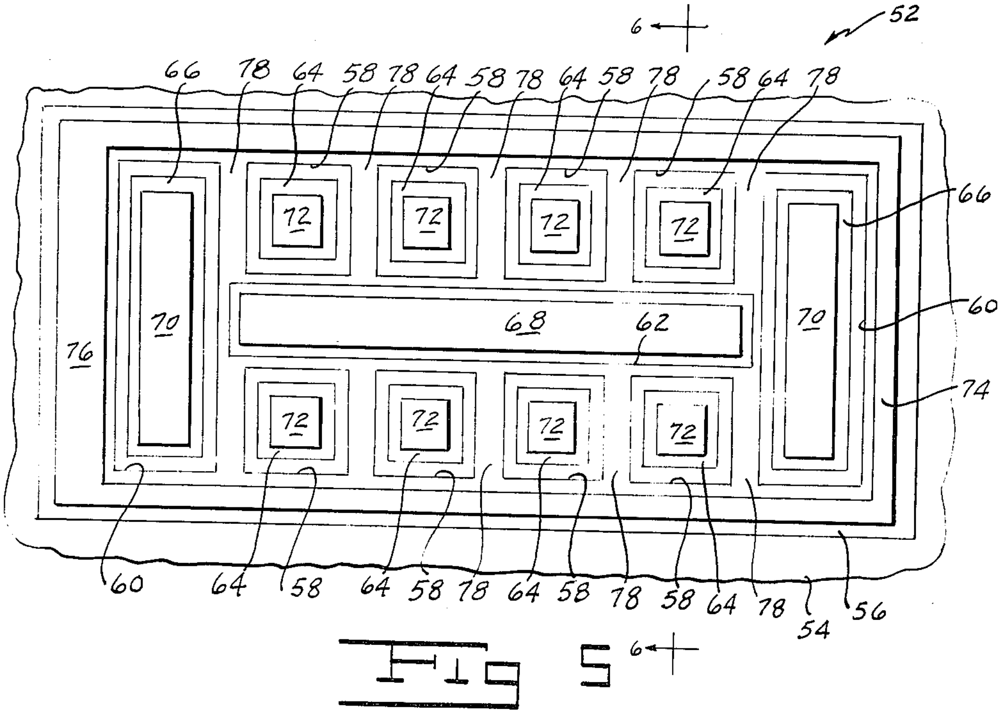
FIGURE 5 is a plan view illustrating the preferred form of my improved planar power transistor.
Figure 6:
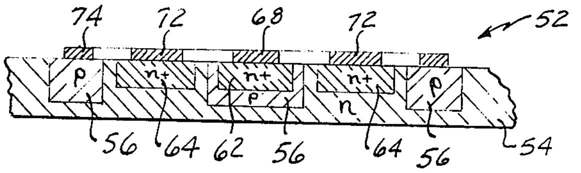
FIGURE 6 is a sectional view of the form of my planar power transistor shown in FIGURE 5 taken along the line 6—6 of FIGURE 5.

Referring now to FIGURES 5 and 6, I have shown a preferred embodiment of my planar transistor indicated generally by the reference character 52. In this form of my invention I first diffuse a generally rectangular area 56 of p-type material into a substrate 54 of n-type material. In performing this diffusion I do not diffuse into a plurality of generally square areas 58 or into two rectangular end areas 60 which are within the p-type diffusion.

After the area 56 has thus been diffused, I diffuse $n^+$ material in a pattern such as will produce a central rectangular area 62 of $n^+$ diffused material in the p-type material. In addition I diffuse $n^+$ material in a plurality of areas 64 within the areas 58 and I diffuse into areas 66 within the areas 60. When these diffusing operations are complete I have produced a base area 56, an emitter area 62 and a plurality of collector areas 64 and 66.

The next step in making the form of my transistor shown in FIGURES 5 and 6 is the application of conductive material to form the ohmic contacts of the transistor. These areas of conductive material provide an emitter contact 68 on the previously diffused $n^+$ emitter area 62, a plurality of collector contacts 70 and 72 and a generally rectangular base contact 74 surrounding all other contacts and having an enlarged side 76 to which an external conductor can be attached. The completed preferred form of my planar transistor comprises a plurality of what can be termed "bus bars" 78 of p-type base material which conduct current from the base contact 74 into the area between the emitter and collector areas. One of the significant advantages of this arrangement is the provision of bus bars or base resistors 78 all of which have substantially the same resistance with the result that the forward potential across the emitter will be approximately equal for all parts of the emitter. It will readily be appreciated that other particular configurations can be arrived at which will function in generally the same manner as the preferred form of my invention.

In the manufacture of the particular form of my improved planar transistor illustrated in FIGURES 1 to 4, I first diffuse or otherwise form the base area 14 of p-type conductivity into the substrate 12. In performing this operation I do not diffuse the areas 16 shown in FIGURE 3. After this first operation has been performed, I next diffuse $n^+$-type conductivity areas 26 and 28 indicated in FIGURE 4. The areas 26 comprise emitter areas while the areas 28 permit ohmic contacts to be made to the substrate 12 forming the collector of my transistor.

Figure 1:
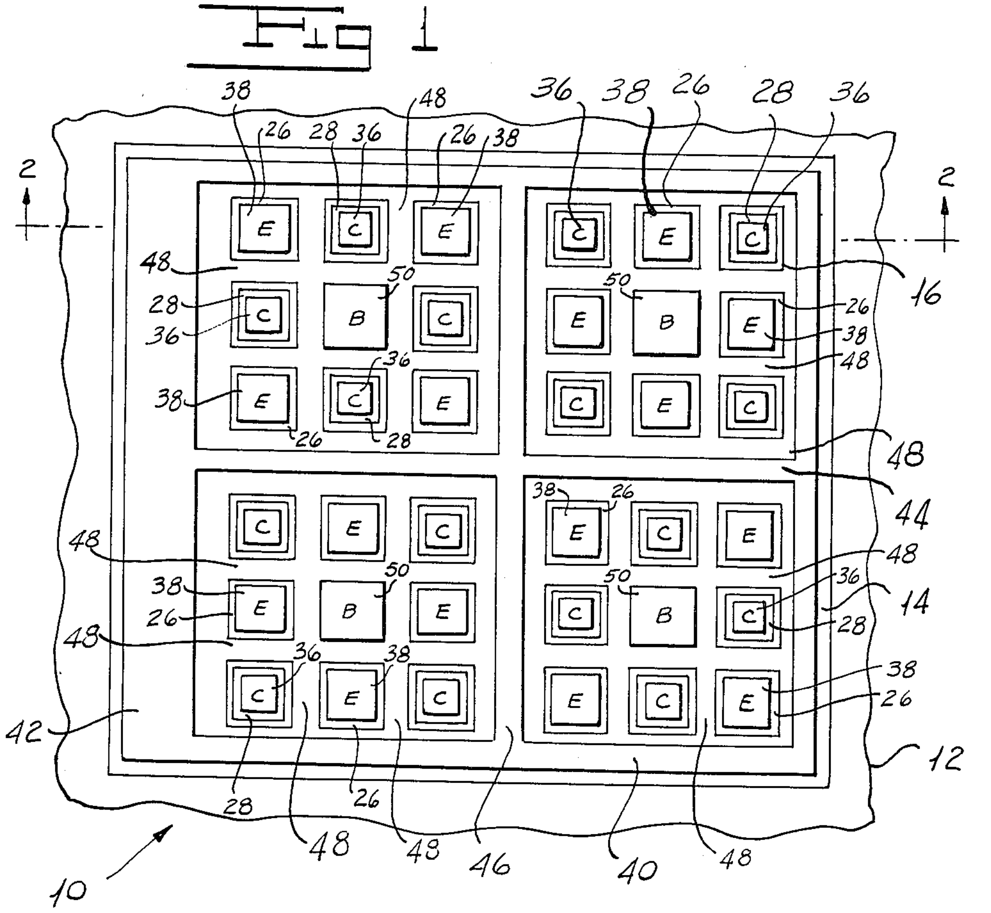
FIGURE 1 is a plan view of my improved planar power transistor.
Figure 2:
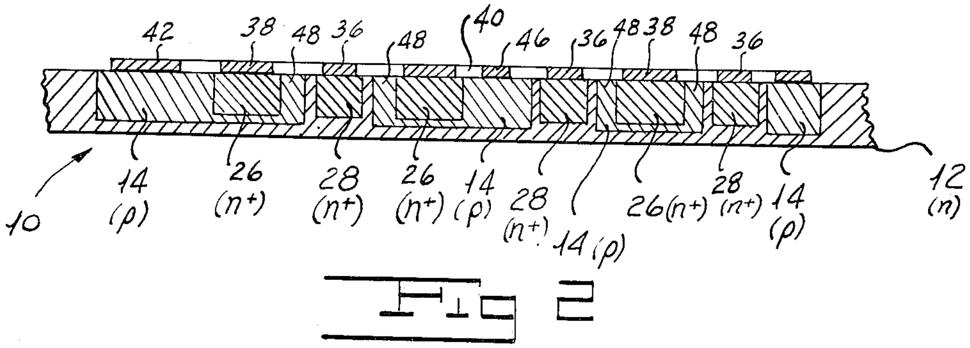
FIGURE 2 is a sectional view of the form of my planar power transistor illustrated in FIGURE 1 taken along the line 2—2 of FIGURE 1.

After I have formed the diffused areas in the manner described above, I apply ohmic contacts 36 to the areas 28 and I apply ohmic contacts 38 to the areas 26. At the same time I form the base ohmic contact by applying the ring 40 of conductive material having an enlarged side 42 and cross connectors 44 and 46 as illustrated in FIGURE 1 of the drawings. Likewise I apply the centrally located areas of base contact material 50. When my transistor is thus completed, it will readily be apparent that there are provided a plurality of relatively narrow channels of p-type base material extending between each pair of adjacent areas 26 and 28 to which emitter and collector contacts 38 and 36 have been applied. These channels 48 apply the base potential in such a manner that the path of flow of current between the emitter edge and the collector area is extremely short.

In manufacturing the preferred form of my planar transistor shown in FIGURES 5 and 6, I so arrange the diffusions that the emitter 62 is surrounded by a plurality of discrete collector areas 64 and 66. The edges of the collector areas adjacent the emitter are located extremely close thereto while the bus bars 78 are relatively wider so as to conduct current to the area between the adjacent emitter and collector areas. In this way I provide a planar transistor which is more efficient than are forms of planar transistor known in the art having relatively high resistance current paths.

It will be seen that I have accomplished the objects of my invention. I have provided a planar transistor which overcomes the defects of planar transistors of the prior art. My transistor is more efficient than are planar power transistors of the prior art. I provide my improved planar transistor with a low series collector resistance without constructing the transistor in such manner as would be inconsistent with other requirements for integrated circuits. The arrangement of my transistor is such that its power output is optimized for the physical size of the transistor.

It will be understood that certain features and subcombinations are of utility and may be employed without reference to other features and subcombinations. This is contemplated by and is within the scope of my claims. It is further obvious that various changes may be made in details within the scope of my claims without departing from the spirit of my invention. It is, therefore, to be understood that my invention is not be limited to the specific details shown and described.

Having thus described my invention, what I claim is:

1. A body of semiconductor material comprising a first region of material of one type conductivity, a second region of material of opposite type conductivity within the first, a first portion of material subtending a first area at a surface of said body, a second portion of material subtending distinct second areas at said surface, bar-shaped portions of said second region separating said second areas from said first area at said surface, one of said first and second portions comprising material of the first region which extends through said second region to said surface and the other of said first and second portions comprising material of said one type conductivity extending into said body from said surface to a depth less than the depth of said second region, said other of the first and second portions being surrounded by said second region, a further portion of said second region outside said first and second and bar-shaped portions and an ohmic contact on said further portion.

2. A body as in claim 1 in which said first region is collector material and in which said second region is base material and in which said first portion is emitter material and in which said second portion is collector material.

3. A body as in claim 1 in which said first region of material is n-type conductivity and in which said second region of material is p-type conductivity and in which said first and second portions are $n^+$-type conductivity.

4. A body of semiconductor material comprising a first region of one type conductivity, a second region of opposite type conductivity within the first, a plurality of discrete first portions of said first region extending through said second region to a surface of said body, a plurality of third regions of said first type conductivity extending into said body from said surface, said third regions being surrounded by and having depths less than the depth of said second region, first portions of said second region being bar-shaped and separating said third regions, a second portion of said second region and an ohmic contact on said second portion.

5. A body as in claim 4 wherein said first region is collector material and wherein said second region is base material and wherein said third regions are emitter material.

6. A body as in claim 4 wherein said first region is n-type conductivity and wherein said second region is p-type conductivity and wherein said third regions are $n^+$-type conductivity.

References Cited by the Examiner

UNITED STATES PATENTS

| | | | |
|---|---|---|---|
| 2,666,814 | 1/1954 | Schockley | 317—235 |
| 2,929,006 | 3/1960 | Herlet | 317—235 |
| 2,981,877 | 4/1961 | Noyce | 317—235 |
| 3,090,873 | 5/1963 | Mackintosh | 317—235 |
| 3,137,796 | 6/1964 | Luscher | 317—234 |

JOHN W. HUCKERT, *Primary Examiner.*

JAMES D. KALLAM, *Examiner.*

A. M. LESNIAK, *Assistant Examiner.*